United States Patent [19]

Hug

[11] 3,947,762

[45] Mar. 30, 1976

[54] PROCESS AND APPARATUS FOR MEASURING THE APPARENT POWER FED TO AN ALTERNATING CURRENT CONSUMER

[75] Inventor: Alfred Hug, Illnau, Switzerland

[73] Assignee: Hug Interlizenz AG, Switzerland

[22] Filed: June 18, 1974

[21] Appl. No.: 480,375

[30] Foreign Application Priority Data

June 21, 1973 Switzerland.......................... 9072/73

[52] U.S. Cl. ................................................ 324/142
[51] Int. Cl.² ......................................... G01R 21/00
[58] Field of Search .................................. 324/142

[56] References Cited
UNITED STATES PATENTS 3,760,273  9/1973  Burkett et al. ..................... 324/142

Primary Examiner—Stanley T. Krawczewicz
Attorney, Agent, or Firm—Larson, Taylor and Hinds

[57] ABSTRACT

An apparatus and method are described wherein the apparent power fed to an alternating current consumer is measured by an active power measuring device or counter through which the current passes and which has a separate voltage input fed from an amplifier having two inputs. The first amplifier input receives a constant, limited auxiliary voltage which is induced from the current path and in phase with the consumer current. The second amplifier input is used for continuously adjusting the auxiliary voltage in accordance with the instantaneous value of the consumer voltage. For this purpose a comparing device, such as a bridge circuit, may be provided for comparing the consumer voltage with the voltage applied to the power measuring device. Variations in the comparison control can be transmitted, for example, by a small electric motor or a sample and hold circuit which in turn controls a solid state or other variable resistance device connected to the second input. In a further alternative, the second amplifier input may be a field plate which is subject to an electromagnetic flux controlled in accordance with the comparing device. In another example, a voltage divider is connected across the consumer voltage and has a center tap connected through a transistor to the second amplifier input.

13 Claims, 6 Drawing Figures

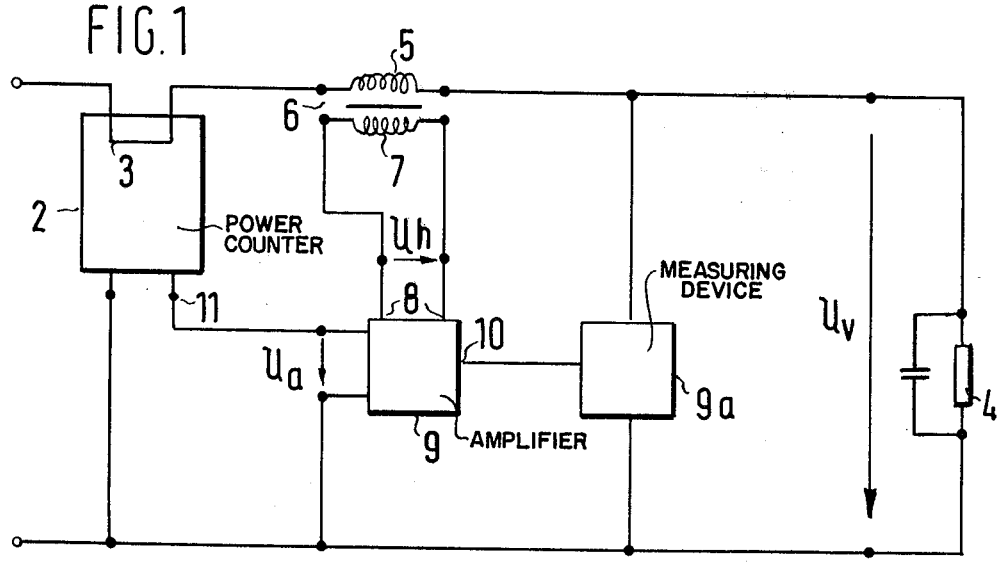
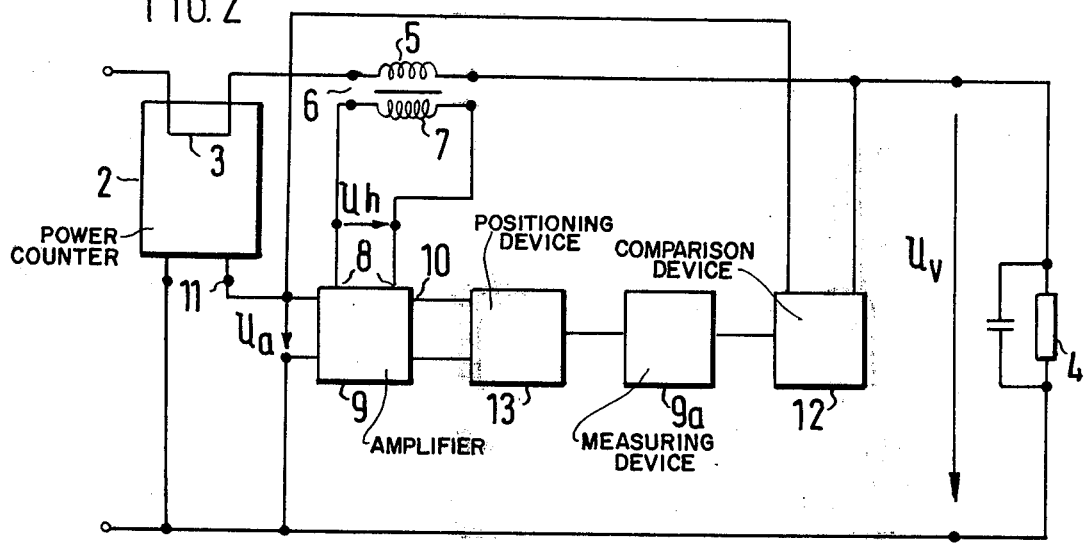

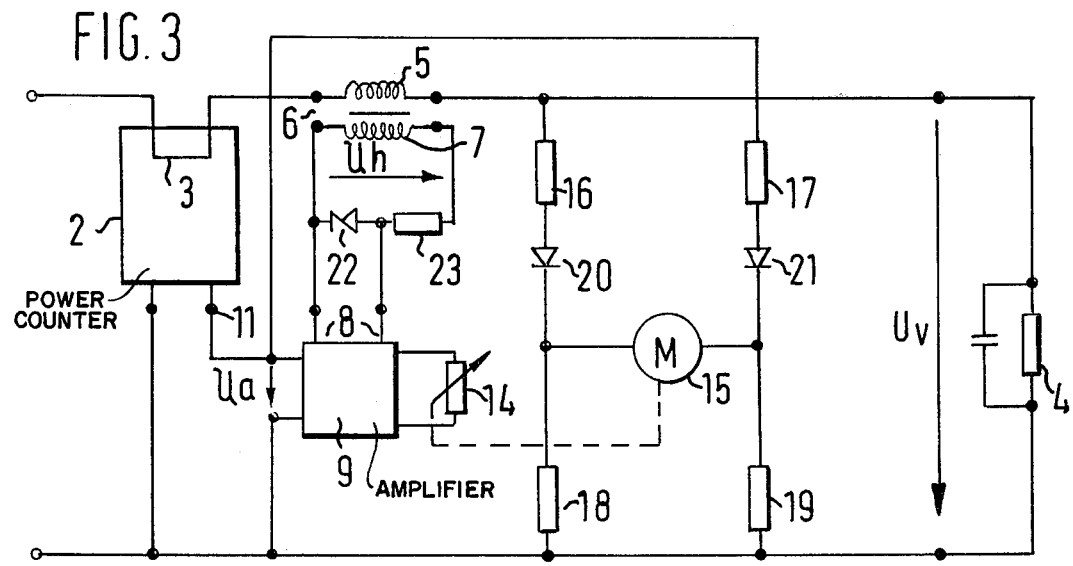
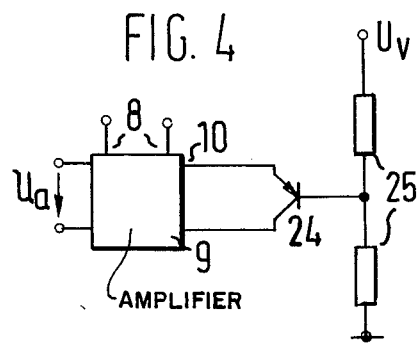
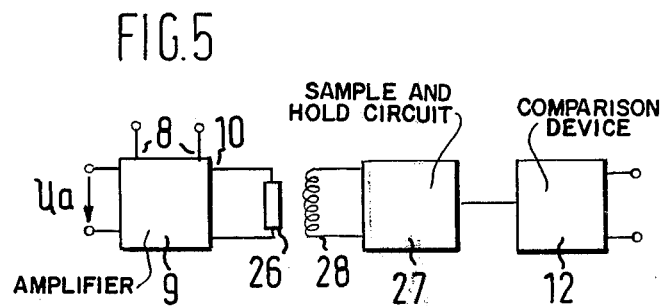
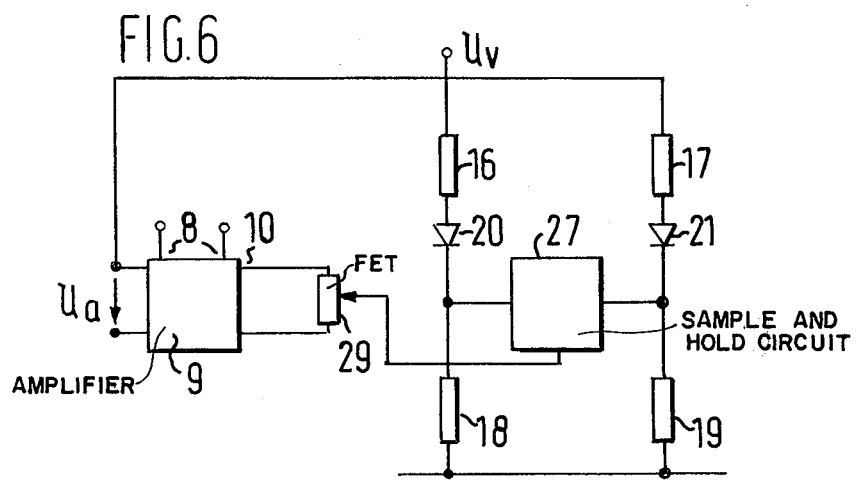

PROCESS AND APPARATUS FOR MEASURING THE APPARENT POWER FED TO AN ALTERNATING CURRENT CONSUMER

The present invention relates to a process and an apparatus for measuring the apparent power fed to an alternative current consumer by means of an active power measuring device or counter. In industry and manufacture, consumers with a complex resistance value, such as motors, transformers and fluorescence lamps, are used more and more frequently. This leads to the distribution networks being loaded to an increasing extent with reactive power.

There exists the possibility of determining the real power consumption by using a reactive power counter in addition to the active power counter, but such a solution is too expensive for small consumers as it is necessary to provide, maintain and read two individual counters.

It is the purpose of the present invention to avoid the disadvantages of the known devices and particularly to provide a process and a device which makes possible counting of apparent power in a most simple manner by using only one active power counter.

According to the present invention, this problem is primarily resolved by deviating from the consumer current an auxiliary voltage in phase with the consumer current, by continuously tapping the consumer voltage and by adjusting the auxiliary voltage independently on the phase position of the consumer voltage to the momentary value and then applying it to the voltage path of the active power counter. Since in this manner, a voltage having the same value as the consumer voltage and in phase with the current flowing through the current path is present on the voltage path of the active power counter, in the active power counter, without influence by phase-shift between voltage and current, the product of these two values is measured and counted.

This invention can be realized in a particularly advantageous manner if, for producing the auxiliary voltage, there is provided a current transformer in series with the current path of the active power counter, the secondary side of said current transformer being thus connected with the first input of an amplifier that the output voltage of the amplifier is in phase with the current primarily flowing through the current transformer, and if a measuring device is provided for determining the consumer voltage which is thus connected with a second input of the amplifier that the output voltage of the amplifier has the same amplitude as the consumer voltage. Depending on the value of the voltage delivered by the current transformer, the amplification factor of the amplifier must then be fixed, the amplifying degree being possibly even lower than one. In order to make the amplifier output voltage nearly independent on the secondary voltage of the current transformer varying as a function of the consumer current, it is recommended to keep the auxiliary voltage on a constant value by means of a limiting circuit known and frequently used in most various forms.

The amplifier output voltage which, as explained above, is determined in its phase position by the consumer current and in its amplitude by the consumer voltage, can be provided in a particularly simple manner if the amplifier comprises a device for varying the amplification degree which is controlled by the measuring device. It is evident that the amplifier feed voltage can be derived directly from the consumer voltage, i.e. by means of rectifying means, one for the positive and one for the negative feed voltage. The consumer voltage can, in certain applications, be used directly for controlling the second amplifier input or the device for varying the amplification degree. If it is necessary to insure in a particularly safe manner that the amplitude of the output voltage of the amplifier is identical with that of the consumer voltage, it is recommendable to provide a comparing device which compares with each other the values of the two above-mentioned voltages and delivers, as a function of a deviation of the amplifier output voltage, corresponding control signals to the measuring device or directly to the second input of the amplifier or to the device for varying the amplification degree.

It is comparatively easy to control the amplification degree of the amplifier by means of a variable resistance, a particularly advantageous solution consisting in the use of a potentiometer.

Especially in such a case, it is recommended to provide the measuring device with an electromechanical transformer, preferably with a positioning motor which is connected with the comparing device and is controlled by the same and effects adjusting of the potentiometer as long as the output voltage of the amplifier does not correspond to the consumer voltage. The comparison between amplifier output voltage and consumer voltage can be achieved in a particularly easy and reliable manner if the comparison device is a direct current bridge circuit in which, preferably, the measuring device is in the transverse path of the bridge.

It is advantageous for adjusting the amplification degree of the amplifier to use also semiconductor elements such as transistors, particularly field effect transistors or field plates, in which latter case a coil for producing a magnetic field influencing the field plate should be provided in series after the measuring device.

The variation of the amplification degree of the amplifier can of course also be realized by means of electronic circuit elements using electromechanical transducers. In this case, a so-called sample and hold circuit is particularly suitable which is connected with the comparison device and assures, by registration of the deviation from the desired value and by delivery of corresponding signals to the second input of the amplifier or the device for adjusting the amplification degree, continuous adjusting of the output voltage of the amplifier to the consumer voltage.

It is evident that the individual circuit elements and features of the circuits can be replaced without difficulty by analogous means and can be assembled by persons acquainted with the art to adapt them to the detailed solution required in any individual case. Especially, the described circuit arrangement may also advantageously be executed as an additional device which permits its use as an apparent power measuring device by insertion or combination therof into or with installed active power counters.

The invention will hereinafter be explained in more detail by means of an example with reference to the attached drawings wherein:

FIG. 1 shows schematically the circuit arrangement of an active power counter for use as apparent power counter, FIG. 2 the circuit of FIG. 1 with an additional comparison device, FIG. 3 the circuit layout of an arrangement according to FIG. 2, and FIGS. 4, 5, 6 various embodiments of devices for varying the amplification degree of the provided amplifier.

According to FIG. 1, an active power counter or watt-meter 2 for one-phase alternating current is inserted into the supply conductor of a load on consumer 4 with a complex resistance by means of its current path 3. The apparent power registered by the power counter 2 is determined by the product of the alternating consumer current $I_r$ passing through the current path 3 and an alternating voltage $Ua$ applied through a voltage path 11. In series with the current path 3 and with the consumer 4, there is provided the primary coil 5 of a current transformer 6, the secondary coil 7 of which is connected with a first input 8 of a controlled amplifier 9. The controlled amplifier 9 preferably is a conventional power control amplifier with an output able to supply the voltage path 11 for the active power counter 2 with a required voltage (e.g. 220V, 6VA). A power control amplifier with an output less than the required voltage may also be used by connecting the output of the amplifier to a suitable voltage transformer. The input 8 of the amplifier 9 is in this case provided as a high ohmic load for the secondary coil 7, in a manner not shown, so that an injected current is delivered. In this manner, it is assured that, upon tapping of a small portion of the voltage on the secondary coil 7, this voltage is indeed in phase with the current flowing through the primary coil. Should there still be a small phase deviation, this can be completely compensated by compensation elements or RC arrangements. By the voltage present at the input 8, which is also in phase with the current flowing through primary coil 5 and consumer 4, the output voltage $Ua$ is controlled in phase with the consumer current $Iv$. By a voltage detector or measuring device 9a provided in parallel with the consumer 4, the consumer voltage $Uv$ is measured and the actual momentary output voltage $Ua$ of the amplifier 9 is controlled via a second input 10 so that the amplification factor of the amplifier 9 is modified and the amplitude of the amplifier output voltage $Ua$ corresponds to the amplitude of the consumer voltage $Uv$. The measuring device 9a may comprise, for example, a positioning motor and a potentiometer driven by the motor as described below with reference to FIG. 3. As an example of such a measuring device is the Minifort 320 of the Megatron company. Since the amplifier output voltage $Ua$ furthermore, as explained, is caused to be in phase with the consumer current $Iv$ by the voltage $Uh$ of the secondary coil 7, a voltage is applied to voltage path 11 of active power counter 2 which, in connection with the current $Iv$ passing through current path 3 permits the formation of the product of consumer voltage $Iv$ and consumer voltage $Uv$ without any influence by the momentary phase situation, and therefore permits measuring of the apparent power.

The amplifier 9 shown in the block scheme and the measuring device 9a (motor) can be interpreted by persons acquainted with the art in various manners and without difficulties so that no detailed explanations will be given here. The positioning device 13 may be a potentiometer driven by the motor 9a (e.g. a DC-Micromotor-Megatron-Series 20 with a model 24-MS gear box and a model S-11 potentiometer).

FIG. 2 shows schematically an apparent power measuring device with a special comparison device 12 (e.g. a Texas Instrument Type 711C Comparator) and with an adjusting device 13 which however, as far as the remaining circuit elements are concerned, corresponds to the arrangement of FIG. 1. As shown, the comparison device 12 is so connected with the output of the amplifier 9 on the one hand and with the consumer 4 on the other hand that the difference between voltage $Uv$ and voltage $Ua$ can be determined. Thereby, the exactitude of the circuit is increased essentially since on the slightest deviation between the voltages compared with each other, the measuring device 9a receives a corresponding signal and accordingly controls a positioning device 13 for modifying the amplification degree of amplifier 9 until the voltage $Ua$ again corresponds to voltage $Uv$. In this manner, it is possible to form a most exact product even under strong variations of the consumer voltage $Uv$ and under disturbing influences acting on amplifier 9.

FIG. 3 shows the circuit scheme of an arrangement in which the amplification degree of amplifier 9 can be modified by variable resistance 14 (e.g. a model S-11 potentiometer). The resistance 14 is mechanically coupled with a positioning motor 15 which is provided in the transverse path of a comparison device in the form of a bridge circuit with resistance 16, 17, 18 and 19. As shown, the consumer voltage $Uv$ is fed via resistance 16 whereas, vis resistance 17, the amplifier output voltage $Ua$ is applied. As soon as the two voltages compared with each other are different from each other, the bridge gets out of its equilibrium condition, and, under control of diodes 20 and 21, a current of such duration and under control of diodes 20 and 21, a current of such duration and quality flows through positioning motor 15 that, after correspondingly adjusting of resistance 14, the amplification factor of amplifier 9 is so modified that the output voltage $Ua$ corresponds to consumer voltage $Uv$.

To keep the auxiliary voltage $Uh$ present on the secondary coil 7 of current transformer 6 which only serves to control the output voltage $Ua$ with respect to its phase, the secondary coil 7 is bridged by a limiting voltage which consists of a Zener diode 22 (ITT BC and 260B) and of a resistance 23 (2000 ohms).

By appropriate selection of the circuit elements, i.e. with a current transformer 6 of appropriate size, a sufficiently big resistance 14 and a sufficiently synchronized and closed amplifier 9, variations of amplifier elements become only active within a fraction of the required precision, the more because amplifier 9 practically acts as control circuit and variations of the amplification, for example by wear, are compensated by corresponding correction on resistance 14. The positioning motor 15 which is preferably provided as extremely small direct current motor is a circuit element which is absolutely reliable which assures precision, reproducibility of the results and reliability of the additional device to the required extent.

FIG. 4 shows a portion of the circuit to demonstrate the use of a transistor 24 as variable resistance which is provided for controlling the amplification degree of amplifier 9 and which is controlled by the consumer voltage $Uv$ via a voltage divider 25.

FIG. 5 shows the use of a field plate 26 as variable resistance for controlling the amplification degree of amplifier 9. For coupling the signal delivered by comparator 12 if there is a difference between the required and the actual value, and for storage of these signals, a so-called sample and hold circuit 27 is connected in series after the comparison device 12 which, upon each difference appearing between the required and the actual value, adds or substracts and stores the corresponding signals. The stored signals are then fed to a coil 28 the electromagnetic field of which influences the field plate 26 and the resistance thereof so that the required adjustment of the degree of amplification of amplifier 9 is achieved. The field plate 26 and coil 28 operate as a Hall generator.

FIG. 6 shows a partial section of a circuit arrangement in which the degree of amplification of amplifier 9 is controlled by field effect transistor 29. This field effect transistor 29, in the example according to FIG. 5, is replaced by a sample and hold circuit 27 with a control signal, the sample and hold circuit being arranged in the transversal path of a bridge circuit consisting of resistances 16, 17, 18 and 19 instead of positioning motor 15. In this manner, a reliable and rapid adjustment of the voltage Ua to the value of consumer voltage Uv is assured.

As a whole, the invention, by the use of most simple and known circuit elements, the dimensions and selection of which are known to persons acquainted with the art, affords the possibility to measure even apparent powers by means of conventional active power counters. The shown and described circuit arrangement can of course also be used analogously and equivalently for power measuring or power control instead of mere power counting without thereby leaving the scope of the invention. It is of course also possible to register the value of consumer voltage digitally and to compare it. In this case, it would only be necessary to transform the consumer voltage via an analogous - digital converter, fed to a counter and, after comparison with an also digital desired value, again be transformed into analogous signals by means of a digital - analogous converter so that the amplifier can be controlled accordingly.

I claim:

1. Apparatus for measuring the apparent power fed to an alternating current consumer comprising: an active power measuring device having a current path therethrough through which, in operation, the consumer current flows and including an input separate from said path to which an auxiliary alternating voltage is applied so that said measuring device measures power as a product of said current and said auxiliary voltage, an amplifier for producing said auxiliary voltage and including an output connected to the input of said power measuring device and first and second amplifier inputs, a transformer having a primary side connected in said current path and a secondary side connected to said first input of said amplifier so that the auxiliary voltage produced by said amplifier is maintained in phase with the consumer current, adjusting means for determining the consumer voltage and connected to said second amplifier input for adjusting the auxiliary voltage produced by said amplifier to the instantaneous value of said consumer voltage.

2. Apparatus according to claim 1, wherein said adjusting means comprises a comparison device having a first input adapted to be connected to the consumer and a second input connected to the output of said amplifier so that said auxiliary voltage is compared with said consumer voltage, said comparison device providing an output representing the difference between said auxiliary voltage and said consumer voltage, an adjusting device responsive to the output of said comparison device, and a variable element adjusted by said adjusting device and connected to the second amplifier input to adjust said auxiliary voltage to the instantaneous value of said consumer voltage.

3. Apparatus according to claim 2, wherein said variable element comprises a variable electrical resistance.

4. Apparatus according to claim 2, wherein said adjusting device comprises an electromechanical transducer.

5. Apparatus according to claim 2, wherein said adjusting device comprises a positioning motor and said variable element comprises a potentiometer mechanically connected to said positioning motor.

6. Apparatus according to claim 2, wherein said comparison device comprises a bridge circuit comprising a first pair of resistances adapted to be connected in series across the consumer and a second pair of resistances connected in series between the output of said amplifier and the low voltage side of said consumer, said adjusting device comprising an electromechanical transducer connected between a point on the series connection between the resistances of the first pair of resistances and a point on the series connection between the resistances of the second pair of resistances.

7. Apparatus according to claim 2, wherein said comparison device comprises a bridge circuit comprising a first resistance, a first rectifier and a second resistance connected in series across said consumer and a third resistance, a second rectifier and a fourth resistance connected in series between the output of said amplifier and the low voltage side of said consumer, said adjusting device comprising an electromechanical transducer connected between a point on the series connection between the first rectifier and the second resistance and a point on the series connection between the second rectifier and the fourth resistance, said variable element comprising a variable electrical resistance controlled by said electromechanical transducer.

8. Apparatus according to claim 2, wherein said variable element comprises a variable electrical resistance constituted by a semiconductor circuit element.

9. Apparatus according to claim 2, wherein said adjusting device comprises a coil responsive to the output of said comparison device and said variable element comprises a field plate responsive to the electromagnetic field of said coil.

10. Apparatus according to claim 2, wherein said comparison device comprises a bridge circuit comprising a first pair of resistances connected in series across the consumer and a second pair of resistances connected in series between the output of said amplifier and the low voltage side of said consumer, said adjusting device comprising a sample and hold circuit connected between a point on the series connection between the resistances of the first pair of resistances and a point on the series connection between the resistances of the second pair of resistances, and said variable element comprising a transistor controlled by said sample and hold circuit.

11. Apparatus according to claim 1, wherein a voltage limiter is connected in circuit relationship with said secondary side of said transformer for maintaining constant the voltage applied to said first amplifier input.

12. Apparatus according to claim 1, wherein said adjusting means comprises a voltage divider adapted to be connected across the consumer and a transistor connected between the second amplifier input and a central tap of said voltage divider.

13. A method of measuring the apparent power fed to an alternating current consumer, said method comprising connecting a current path carrying the consumer current through an active power measuring device, inducing an auxiliary voltage from said current path which is in phase with the consumer current and is of constant value, continuously adjusting said auxiliary voltage in accordance with the instantaneous value of the consumer voltage, and applying the adjusted voltage to the power measuring device so that the output of said power measuring device is a product of said consumer current and the adjusted auxiliary voltage.

* * * * *